United States Patent
Yamazaki et al.

(10) Patent No.: US 6,444,390 B1
(45) Date of Patent: Sep. 3, 2002

(54) PROCESS FOR PRODUCING SEMICONDUCTOR THIN FILM DEVICES USING GROUP 14 ELEMENT AND HIGH TEMPERATURE OXIDIZING TREATMENT TO ACHIEVE A CRYSTALLINE SILICON FILM

(75) Inventors: Shunpei Yamazaki, Tokyo; Hisashi Ohtani, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/251,384

(22) Filed: Feb. 17, 1999

(30) Foreign Application Priority Data

Feb. 18, 1998 (JP) .......................................... 10-052851

(51) Int. Cl.$^7$ .............................................. H01L 21/84
(52) U.S. Cl. ........................................ 430/166; 438/486
(58) Field of Search ................................ 438/166, 149, 438/151, 479, 486

(56) References Cited

U.S. PATENT DOCUMENTS

| | | | |
|---|---|---|---|
| 5,424,244 A | | 6/1995 | Zhang et al. |
| 5,550,070 A | * | 8/1996 | Funai et al. ................. 438/486 |
| 5,594,569 A | | 1/1997 | Konuma et al. |
| 5,643,826 A | | 7/1997 | Ohtani et al. |
| 5,648,277 A | | 7/1997 | Zhang et al. |
| 5,700,333 A | | 12/1997 | Yamazaki et al. |
| 5,830,784 A | | 11/1998 | Zhang et al. |
| 5,859,443 A | | 1/1999 | Yamazaki et al. |
| 5,893,949 A | * | 4/1999 | King et al. .................... 117/97 |
| 5,897,347 A | | 4/1999 | Yamazaki et al. |
| 5,913,111 A | * | 6/1999 | Kataoka et al. ............. 438/163 |
| 5,915,174 A | | 6/1999 | Yamazaki et al. |
| 5,932,892 A | | 8/1999 | Hseuh et al. |
| 5,932,893 A | | 8/1999 | Miyanaga et al. |
| 5,953,597 A | | 9/1999 | Kusumoto et al. |
| 5,961,743 A | | 10/1999 | Yamazaki et al. |
| 5,962,871 A | | 10/1999 | Zhang et al. |
| 5,977,559 A | | 11/1999 | Zhang et al. |
| 6,140,165 A | | 10/2000 | Zhang et al. |

FOREIGN PATENT DOCUMENTS

| | | |
|---|---|---|
| JP | 9-312260 | 12/1997 |
| JP | 09-312260 | 12/1997 |

OTHER PUBLICATIONS

Lo et al., "Thin Fluorinated Gate Dielectrics Grown by Rapid Thermal Processing in O2 with Dileuted NF3", Jan. 1992, IEEE Transactions on Electron Devices, vol. 39, No. 1, Jan. 1992.*

Subramanian, V. et al, "A Novel Technique for 3–D Integration: Ge–Seeded Laterally Crystallized TFTs," 1997 Symposium on VLSI Technology, Jun. 10–12, 1997, Digest of Technical Papers, pp. 97–98, 1997.

(List continued on next page.)

Primary Examiner—Michael J. Sherry
Assistant Examiner—Evan Pert
(74) Attorney, Agent, or Firm—Cook, Alex, McFarron, Manzo, Cummings & Mehler, Ltd.

(57) ABSTRACT

Under the conditions in that a germanium film 103 is formed on an amorphous silicon film 102, a first heat treatment (crystallization step) at from 450 to 600° C. is conducted. A second heat treatment is conducted for the resulting polysilicon film 104 at a temperature (from 800 to 1,050° C.) higher than the crystallization temperature. Through these steps, the boundary between the underlayer and silicon is fixed, to obtain a polysilicon film 105 containing substantially no defect in its crystal grain.

21 Claims, 8 Drawing Sheets

OTHER PUBLICATIONS

Mayer, J.W. et al, *Electronic Materials Science: For Integrated Circuits in Si and GaAs*, chapter 6.8, "*Gettering in Si*," MacMillan Publishing Company, New York, NY, pp. 176–179.

King, T.J. et al, "Polycrystalline Silicon–Germanium Thin–Film Transistors," IEEE Transactions on Electron Devices, vol. 41, No. 9, pp. 1581–1591, Sep., 1994.

Yoshida, T. et aL, "A Full–Color Thresholdless Antiferroelectric LCD Exhibiting Wide Viewing Angle with Fast Response Time," SID Digest, pp. 841–844, 1997.

Furue, H. et al, "Characteristics and Driving Scheme of Polymer–Stabilized Monostable FLCD Exhibiting Fast-Response Time and High Contrast Ratio with Gray–Scale Capability," SID Digest, p–78, 1998.

* cited by examiner

5 μm

5 μm

PROCESS FOR PRODUCING SEMICONDUCTOR THIN FILM DEVICES USING GROUP 14 ELEMENT AND HIGH TEMPERATURE OXIDIZING TREATMENT TO ACHIEVE A CRYSTALLINE SILICON FILM

FIELD OF THE INVENTION

The present invention relates to a process for producing a semiconductor thin film formed on a subtrate having an insulated surface. It also relates to a process for producing a semiconductor device having a circuit comprising a thin film transistor (TFT) using such the semiconductor thin film.

The term "semiconductor device" used herein includes all devices and apparatuses that function utilizing the characteristic nature of a semiconductor. Therefore, the semiconductor device used herein includes not only a simple device such as a TFT, but also a semiconductor circuit and an electro-optical apparatus comprising the TFT, as well as an electronic apparatus comprising them as a part.

BACKGROUND OF THE INVENTION

A technique of producing a TFT by using a semiconductor thin film (having a thickness of about from several tens to several hundreds nm) formed on a substrate having an insulated surface has recently received attention. A TFT is being urgently developed as a switching device of an image display apparatus (for example, a liquid crystal display apparatus).

For example, in a liquid crystal display apparatus, there has been an attempt to apply a TFT to all semiconductor circuits including a pixel matrix circuit controlling individual pixel regions arranged in the form of a matrix, a driving circuit controlling the pixel matrix circuit, and a logic circuit processing data signals from the outside (an arithmetic circuit, a memory circuit and a clock generator).

Recently, a TFT utilizing a crystalline silicon film (polysilicon film) is mass produced owing to its advantage in that a TFT having an operation speed higher than an amorphous silicon film can be produced.

The inventors have studied about a polysilicon film, and have urgently developed a polysilicon film having characteristics closer to a single crystal. As a production process of such a polysilicon film, the inventors disclose a technique described in Unexamined Published Japanese Patent Application No. 9-312260, which in turn corresponds to a pending U.S. application Ser. No. 08/785489. An entire disclosure of Japanese patent Application 9-312260 and U.S. application Ser. No. 08/785489 is incorporated herein by reference.

The publication discloses a method of improving the crystallinity of a polysilicon film on crystallization of an amorphous silicon film, in which a heat treatment at a temperature exceeding 700° C. is conducted after crystallization, utilizing nickel as a catalyst element accelerating the crystallization.

However, when a polysilicon film using nickel as a catalyst for crystallization is heat-treated taking into direct contact with an oxidative atmosphere, there are some cases where abnormal growth of silicon oxide ($SiCd_x$) occurs.

The abnormal growth of the silicon oxide appears on the surface of the polysilicon film in the form of a welt. If such silicon oxide is present, a problem arises in that only the silicon oxide is removed during the production process of the TFT, and the silicon is divided.

Therefore, the polysilicon film produced by the technique described in the publication should be avoided from the heat treatment where the surface of the polysilicon film is in direct contact with an oxidative atmosphere. For example, in the case where a thermal oxidized film is formed on the surface of the polysilicon film, measures such as an insulating film covering the surface is required, which becomes a factor of making the process complicated.

SUMMARY OF THE INVENTION

The invention has been conducted in view of the problems described above. An object of the invention is to provide a process for producing a semiconductor thin film having high crystallinity without generation of abnormal growth of silicon oxide. Another object of the invention is to provide a semiconductor device having a circuit comprising a TFT using the semiconductor thin film.

The basic constitution of the invention is characterized in that an amorphous semiconductor thin film (typically an amorphous silicon film) is crystallized by using an element selected from the group 14 (particularly preferably germanium) as a catalyst element, and the resulting polycrystalline semiconductor thin film (typically a polysilicon film) is subjected to a heat treatment at a temperature higher than the heat treating temperature on the crystallization (hereinafter called as a crystallization temperature).

A technique of crystallizing an amorphous silicon film using germanium as a catalyst element has been known. The invention is based on the finding in that a polysilicon film having extremely high crystallinity with defects within crystal grains being reduced can be obtained by subjecting the polysilicon film thus obtained to a heat treatment at a temperature higher than the crystallization temperature.

In the technique described in said Unexamined Published Japanese Patent Application No. 9-31226C, there is possibility of forming the abnormal growth of silicon oxide depending on the conditions, but there is no such possibility in the invention. As a result, the complicated procedure, where the surface of the polysilicon film is covered with silicon oxide film on heat-treating at a temperature higher than the crystallization temperature, is not required.

Attention should be paid since germanium has a lower melting point than silicon. When germanium is present in a silicon film in a concentration of $1 \times 10^{20}$ atoms/cm$^3$ or more, there is possibility in that the silicon film begins to melt at a temperature of about 900° C. Therefore, the crystallization temperature is preferably determined by taking the concentration of germanium added to the amorphous silicon film into consideration.

DESCRIPTION OF PREFERRED EMBODIMENTS

Figure 1A:
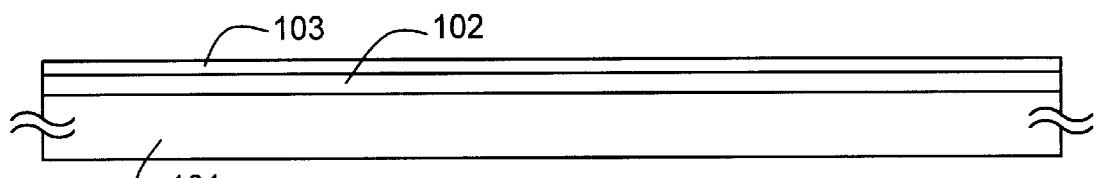
FIGS. 1A, 1B and 1C are figures showing the process for producing a polysilicon film.

Embodiments of the invention are described in detail with reference to the following examples.

EXAMPLE 1

In this example, a process for producing a polysilicon film utilizing the invention is described with reference to FIGS. 1A, 1B and 1C. A substrate 101 is prepared. Since a heat treatment exceeding 700° C. is conducted in the invention, the substrate should comprise a material having high heat resistance, such as a quartz substrate, a crystallized glass substrate, a ceramic substrate and a silicon substrate. It is preferred that an underlying film is formed on the substrate depending on necessity.

In this example, a quartz substrate is used as the substrate 101, and an amorphous silicon film 102 is formed directly on it. The formation of the amorphous silicon film is conducted by the reduced pressure heat CVD process or the plasma CVD process, and silane ($SiH_4$) or disilane ($Si_2H_6$) is used as a film forming gas. The film thickness of the amorphous silicon film is from 30 to 250 nm (typically from 100 to 150 nm). (FIG. 1A)

Contamination with carbon, oxygen and nitrogen during the film formation brings about possibility of inhibiting crystallization of the later stage, and they are preferably thoroughly removed. Specifically, it is preferred that the concentrations of carbon and nitrogen each are less than $5 \times 10^{18}$ atoms/$cm^3$ (typically $5 \times 10^{17}$ atoms/$cm^3$ or less), and the concentration of oxygen is less than $1.5 \times 10^{19}$ atoms/$cm^3$ (typically $1 \times 10^{18}$ atoms/$cm^3$ or less).

It is the experience of the inventors that the characteristics of a TFT are suddenly deteriorated when the concentrations of carbon, oxygen and nitrogen exceed the above ranges. It is considered that the crystallization of silicon is inhibited, and a polysilicon film having sufficient crystallinity cannot be obtained. Therefore, it is important that the concentrations should be within the ranges described above. The concentrations of the impurities described above do not exceed the concentration ranges described above unless they are intentionally added during the production process of the TFT.

A crystallization step of the amorphous silicon film 102 is then conducted. In this example, germanium is used as a catalyst element accelerating crystallization during the crystallization of the amorphous silicon film.

In this example, a germanium film 103 is formed by the plasma CVD process on the amorphous silicon film 102 thus formed. A germane ($GeH_4$) gas diluted with hydrogen or helium at from 5 to 10 times is used as a film forming gas. The germanium film having a thickness of from 1 to 50 nm (typically from 10 to 20 nm) can be formed at a film forming temperature of from 100 to 300° C. with discharging at from 20 to 50 mW/$cm^2$.

The formation of the germanium film 103 may be conducted by the reduced pressure heat CVD process. Since germane is an extremely decomposable gas, it is decomposed at a low temperature of about 450° C. and a germanium film is formed.

The state shown in FIG. 1A is thus obtained. A heat treatment at a temperature of from 450 to 650° C. (preferably from 500 to 550° C.) is then conducted to crystallize the amorphous silicon film. The upper limit of 600° C. is set because when the temperature exceeds this value, the spontaneous nucleus formation increases to co-exist with crystals formed with the germanium as nuclei, and the crystallinity is disturbed. (FIG. 1B)

The crystallization step may be conducted by any one of furnace annealing, lamp annealing and laser annealing. In this example, regarding the uniformity of the film thus formed as important, furnace annealing is employed.

A polysilicon film 104 thus obtained has excellent crystallinity even though it is formed at a low temperature of about 500° C. An object of the invention is to further improve the crystallinity of the polysilicon film 104 thus obtained.

The germanium film remaining on the polysilicon film 104 is removed by a mixture of sulfuric acid and hydrogen peroxide solution ($H_2SO_4:H_2O_2=1:1$), and a heat treatment is conducted for the polysilicon film 104 at a temperature higher than the crystallization temperature described above (typically from 800 to 1,050° C.). (FIG. 1C)

By the heat treatment, a polysilicon film 105 having high crystallinity is formed. A thermal oxidized film 106 is formed on the polysilicon film 105 by the heat treatment. The thermal oxidized film 106 can be used by itself as a gate insulating film upon production of the TFT.

The heat treatment can be conducted with the germanium film remaining. In this case, a state where germanium is present in the film at a high concentration is obtained. In any case, the polysilicon film 105 heat-treated contains germanium through diffusion at a concentration of from $1 \times 10^{14}$ to $5 \times 10^{19}$ atoms/$cm^3$ (typically from $1 \times 10^{15}$ to $1 \times 10^{16}$ atoms/$cm^3$).

Accordingly, the polysilicon film 105 obtained in this example contains a large amount of bonds, in which a silicon atom is substituted by a germanium atom, and it is considered that the polysilicon film becomes a semiconductor thin film like a silicon germanium semiconductor represented by $Si_xGe_{1-x}$ (0<x<1).

The production process of this example has an advantage in that the abnormal growth of silicon oxide, as described for the conventional technique, does not occur. In the polysilicon film 105 obtained by the process of this example, the abnormal growth of silicon oxide does not occur even though it is thermally oxidized under the condition of contacting with an oxidative atmosphere.

According to the inventors, the abnormal growth of silicon oxide occurring when using nickel as a catalyst for crystallization is caused by nickel silicide present in the polysilicon film which is intensively oxidized. Therefore, because germanium having high conformity with silicon is used as a catalyst but nickel is not used in the invention, it is considered that such localized abnormal oxidation does not occur.

Figure 4A:
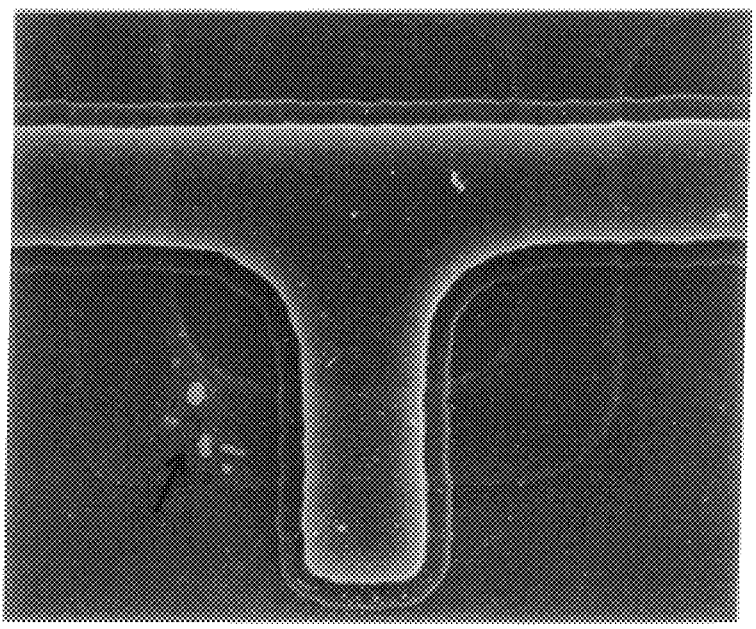
FIGS. 4A and 4B are SEM photographs showing the abnormal growth of silicon oxide.
Figure 4B:
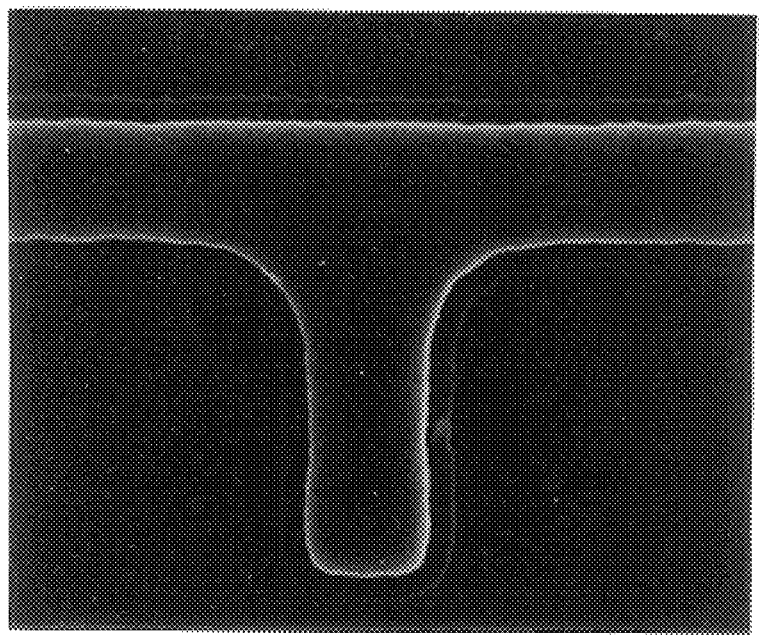

FIG. 4A is a SEM photograph in the case where the abnormal growth of silicon oxide occurs. It can be confirmed that silicon oxide is abnormally formed at the position pointed by the arrow, and the silicon film as an active layer is substantially divided. On the other hand, the SEM photograph shown in FIG. 4B is an example where a TFT having the same structure is produced by the process of this example, and the abnormal growth of silicon oxide is completely not observed in the active layer.

Figure 1B:
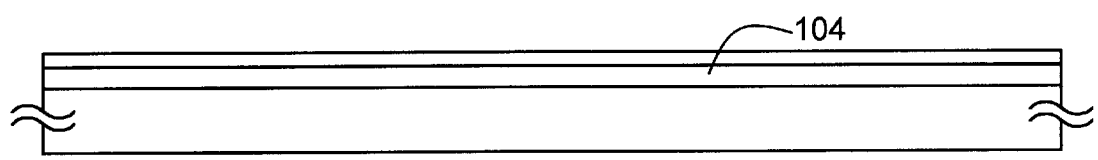
Figure 1C:
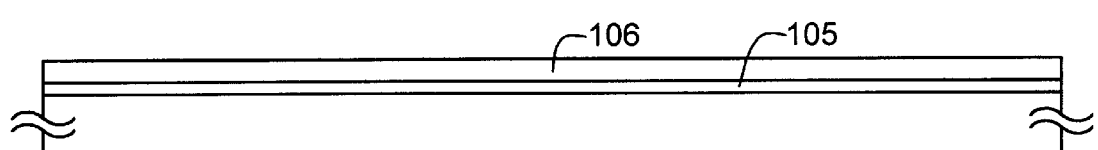

By the heat treatment shown in FIG. 1C, defects in the crystal grains of the polysilicon film 104 can be substantially completely removed. The polysilicon film 104 after finishing crystallization, i.e., in the state shown in FIG. 1B, contains a large number of defects (such as a stacking fault and a dislocation) in crystal grains. The polysilicon film 105 obtained through the step of FIG. 1C, on the other hand, contains substantially no defect in crystal grains.

The inventors expect the following model for the effect described above. There is a difference in thermal expansion coefficient by about 10 times between the polysilicon film and quartz (silicon oxide) as an underlayer. Therefore, at the time when the amorphous silicon film is converted into the polysilicon film, a large stress is formed on cooling the polysilicon film.

Figure 5A:
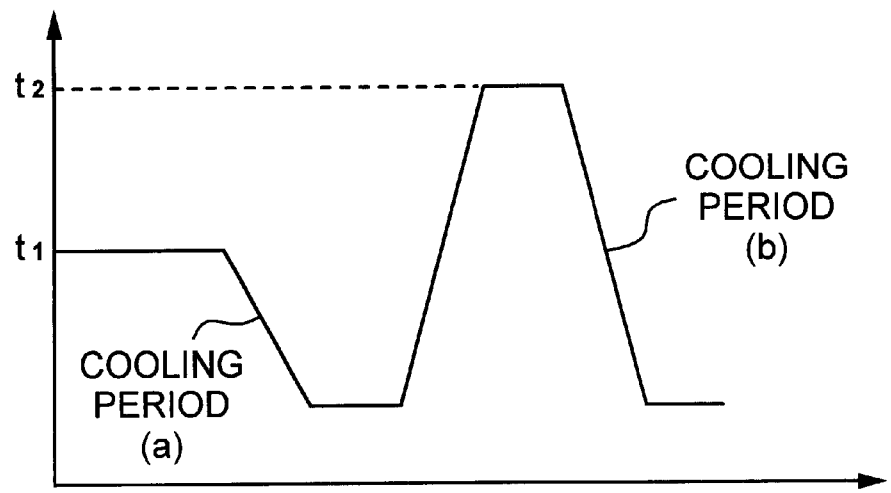
FIGS. 5A, 5B and 5C are figures showing a step of fixing the boundary between an underlayer and silicon.

The phenomenon is described with reference to FIGS. 5A, 5B and 5C. FIG. 5A shows a thermal history of the polysilicon film after the crystallization step. The polysilicon film crystallized at the temperature $t_1$ is cooled to room temperature over the cooling period (a).

Figure 5B:
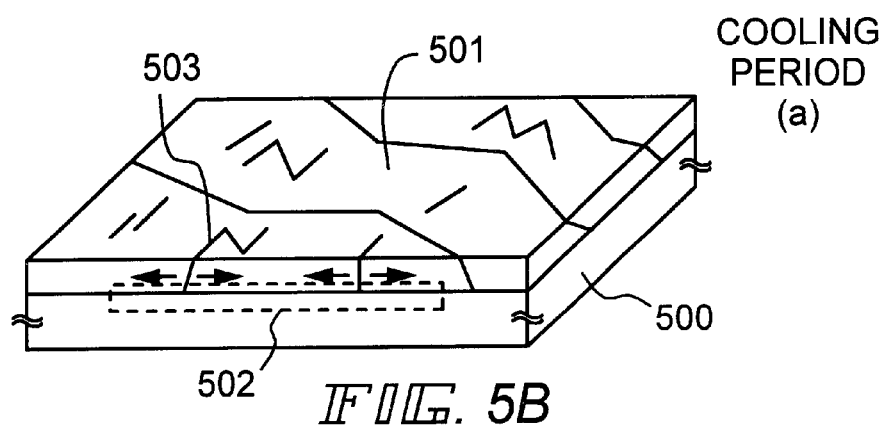
Figure 5C:
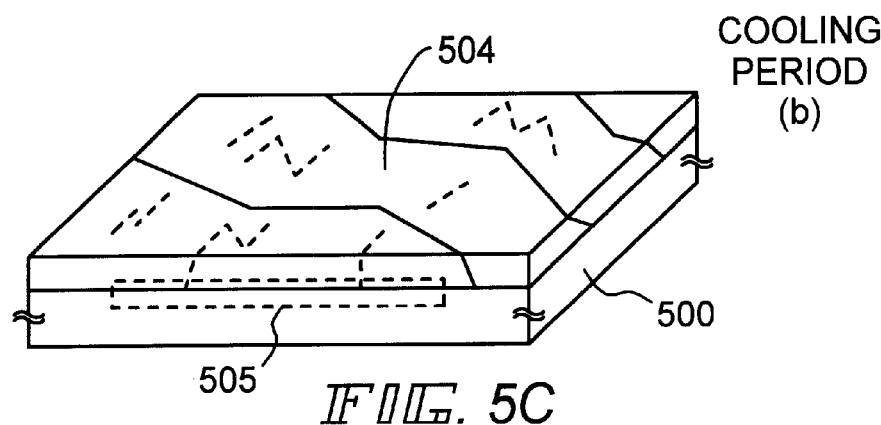

FIG. 5B shows the polysilicon film in the cooling period (a), in which numeral 500 denotes the quartz substrate and 501 denotes the polysilicon film. At this time, the adhesion strength at the boundary 502 between the polysilicon film 501 and the quartz substrate 500 is not so large, and as a result, a number of defects are present in the crystal grains.

It is considered that the polysilicon film 501 tensed by the difference in thermal expansion coefficient is very 10 movable on the quartz substrate 500, and defects 503, such as a stacking fault and a dislocation, are easily formed by a force such as a tensile stress.

The polysilicon film thus obtained corresponds to the polysilicon film 104 in FIG. 1B. A heat treatment at a temperature $t_2$ shown in FIG. 5A is then conducted, and substantially all the defects in crystal grains are disappeared. It is considered that this is because silicon atoms of lattice invasion type present within the lattice migrate to compensate the defects by heat treatment.

A large amount of such silicon atoms of lattice invasion type are formed on the thermal oxidation step, and thus the defects can effectively removed by conducting the heat treatment at a temperature exceeding the crystallization temperature in an oxidative atmosphere.

After the defects in crystal grains are removed by the heat treatment, the substrate is again cooled to room temperature over the cooling period (b). The cooling period (b) is different from the cooling period (a) after the crystallization step in that the boundary 505 between the quartz substrate 500 and the polysilicon film 504 after annealing is in a state of extremely high adhesion strength. (FIG. 5C)

Because the polysilicon film 504 is completely fixed to the quartz substrate 500 due to such high adhesion strength, even though a stress is formed in the polysilicon film during the cooling period of the polysilicon film, no defect is formed in the polysilicon film. That is, it can prevent recurrence of defects.

By conducting the heat treatment at a temperature exceeding the crystallization temperature after completing the crystallization, the boundary between the polysilicon film and the underlayer is fixed, so as to remove the defects in crystal grains and, at the same time, to prevent recurrence of them. The inventors call this heat treatment step as a fixing step of the silicon boundary.

While the process where the temperature is lowered to room temperature after the crystallization step is exemplified in FIG. 5A, after finishing the crystallization, the temperature may be raised to conduct the fixing step. The polysilicon film having the similar crystallinity can be obtained by such a process.

The polysilicon film 105 thus obtained has a characteristic feature in that the number of defects in the crystal grains is far smaller than the polysilicon film 104 that has been subjected to only the simple crystallization. The difference in number of defects appears as the difference in spin density by electron spin resonance (ESR) analysis.

As described above, the most important features of the invention are the following two points. (1) The crystallization of the amorphous silicon film by using germanium as a catalyst. (2) The resulting polysilicon film is subjected to a heat treatment at a temperature exceeding the crystallization temperature.

By employing the step (1), the abnormal oxidation of the polysilicon film in the subsequent step (2) can be prevented. Accordingly, the process does not become complicated in the heat treatment of the polysilicon film. Furthermore, defects in crystal grains of the polysilicon film are removed by the step (2), to obtain a polysilicon film having extremely high crystallinity.

The temperature exceeding the crystallization temperature is typically from 800 to 1,050° C. (preferably from 850 to 900° C.), and the invention is characterized by conducting the heat treatment at such a high temperature. It is considered that the thermal oxidation mechanism largely contributes to the reduction of defects in crystal grains in this step, and thus conditions where thermal oxidation is liable to occur is preferably employed.

Therefore, the lower limit of the temperature of the heat treatment is preferably 800° C. taking the throughput into consideration, and the upper limit is preferably 1,050° C. taking the heat resistance of the substrate (quartz in this example) into consideration. Since the melting point of germanium is from 930 to 940° C., the upper limit is more preferably 900° C.

The heat treatment atmosphere is preferably an oxidative atmosphere, and it may be an inert atmosphere. In the case using the oxidative atmosphere, any one of a dry oxygen ($O_2$) atmosphere, a wet oxygen ($O_2+H_2$) atmosphere and an atmosphere containing halogen ($O_2+HCl$, etc.) can be used.

Particularly, when the heat treatment is conducted in the atmosphere containing halogen, excess germanium present within the lattice of the polysilicon is removed in the form of volatile $GeCl_4$ by the gettering effect of a halogen element. Therefore, it is an effective measure for obtaining a polysilicon film having less lattice distortion.

Furthermore, a thermal oxidized film is formed by heat treating at a temperature of from 800 to 1,050° C. in an oxidative atmosphere, and thus the polysilicon film itself is thinned. While the thinning of the polysilicon film is effective in lowering of the off current of the TFT (drain current flowing in an off state) and improvement of the mobility, attention should be given since if it is too thin, a problem of defective contact of the source-drain may arise.

Upon practicing the invention, the film thickness on film formation of the amorphous silicon film is determined with taking the thinning on the thermal oxidation step into consideration, and it is preferably designed in such a manner that the film thickness finally utilized as the active layer of the TFT becomes from 5 to 50 nm (preferably from 15 to 45 nm). When the film thickness is less than 5 nm, it becomes difficult to produce the normal source-drain contact, and when it exceeds 50 nm, the effect of thinning the film becomes poor.

The polysilicon film of this example obtained by the production process described above has extremely high crystallinity, and is a semiconductor thin film that is optimum as an active layer of a thin film transistor. Its crystalline structure is characteristic.

By observing crystal grain boundaries of the polysilicon film produced in this example with a high resolution TEM (transmission electron microscope), there is a characteristic feature in that a lattice stripe linearly continues over two crystal grains forming a crystal grain boundary. This indicates that the continuity of the crystal lattice is maintained across the crystal grain boundary. As a result of detailed observation of the TEM phonograph obtained by the high resolution TEM, it is confirmed that the continuity across the crystal grain boundary is found in 90% or more (typically 95% or more) of the crystal lattice. Accordingly, the polysilicon film of the invention has a structural characteristic feature in that 90% or more of the lattice stripes continue irrespective of the crystal grain boundaries even when any part of the crystal grain boundaries is observed.

This suggests that two different crystal grains be joined with excellent conformity at the crystal grain boundary. The crystal lattice continues at the crystal grain boundary, to constitute the structure that is difficult to form a trap level caused by a crystal defect.

Such continuity at the crystal grain boundary is an extremely unique structure, which does not appear in the general polysilicon film (a film generally called as a low temperature polysilicon or a high temperature polysilicon).

EXAMPLE 2

In this example, a production process of a TFT using the polysilicon film shown in Example 1 is described with reference to FIGS. 2A, 2B, 2C, 2D, 3A, 3B and 3C. An active matrix liquid crystal display apparatus (AMLCD), in which a driver circuit comprising a CMOS circuit and a pixel matrix circuit comprising an N channel TFT (NTFT) are integrated on a substrate, is exemplified in this example.

Figure 2A:
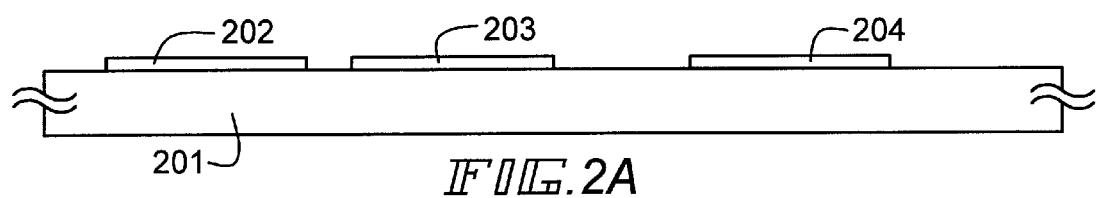
FIGS. 2A, 2B, 2C and 2D are figures showing the process for producing TFTs.

A polysilicon film is formed on a quartz substrate 201 according to a step of Example 1, followed by patterning, to form active layers of the TFT 202, 203 and 204. The thickness of the active layer can be adjusted by the film thickness of an amorphous silicon film on film formation and the extent of the subsequent thermal oxidation. In this example, the thickness is 40 nm in this stage. (FIG. 2A)

A gate insulating film 205 comprising a silicon oxide film is formed by the plasma CVD process (or the reduced pressure thermal CVD process) to a thickness of 120 nm. A silicon oxide nitride film (represented by $SiO_xN_y$) or a silicon nitride film may be used instead. Furthermore, a laminated structure comprising their arbitrary combination may be used.

Figure 2B:
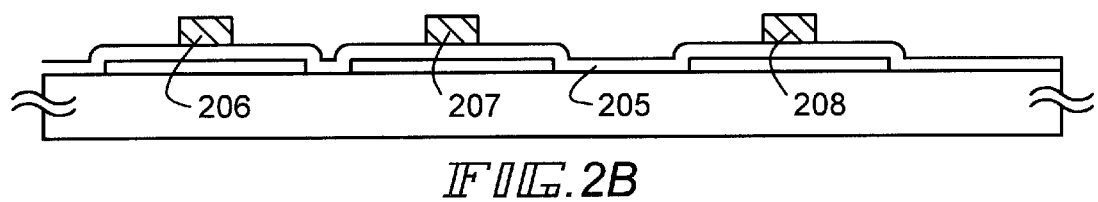

Gate electrodes 206, 207 and 208 comprising a polysilicon film exhibiting N type conductivity are formed on the gate insulating film 205. The thickness of the gate electrodes 206, 207 and 208 may be selected from the range of from 200 to 300 nm. (FIG. 2B)

After forming the gate electrodes 206, 207 and 208, the gate insulating film 205 is etched by the dry etching method by using the gate electrodes 206, 207 and 208 as a mask. In this example, $CHF_3$ gas is used for etching the silicon oxide film.

Through this step, a state where the gate insulating film only remains immediately under the gate electrode (and the gate wiring) is obtained. The gate insulating film remaining under the gate electrodes is the parts actually functioning as the gate insulating film.

Figure 2C:
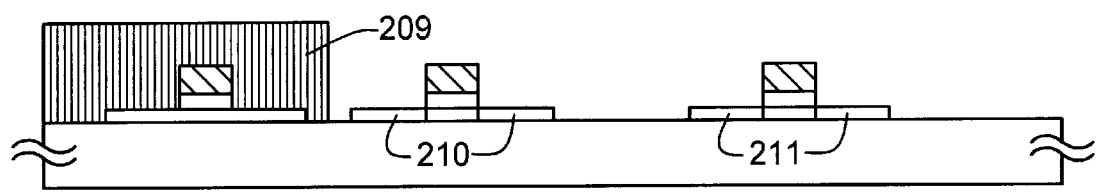

The region to be a PTFT is covered with a resist mask 209, an impurity imparting N type conductivity (phosphorous in this example) is added by the ion implantation method or the plasma doping method. A part of low concentration impurity regions 210 and 211 formed at this time becomes an LDD (lightly doped drain) region, and thus phosphorus is added in a concentration of from $1\times10^{17}$ to $5\times10^{18}$ atoms/cm$^3$. (FIG. 2C)

After removing the resist mask 209, the region to be an NTFT is covered with a resist mask 212, and an impurity imparting P type conductivity (boron in this example) is added by the ion implantation method or the plasma doping method. In this case, a low concentration impurity region 213 is formed as similar to the case of phosphorus. (FIG. 2D)

Figure 2D:
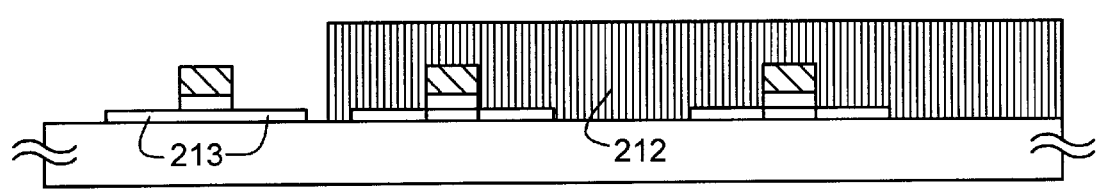

After obtaining the state of FIG. 2D, the resist mask 212 is removed, and side walls 214, 215 and 216 are formed by using the etch back method. In this example, the side walls 214, 215 and 216 are formed by using silicon nitride film.

After forming the side walls 214, 215 and 216, the region to be the PTFT is again covered with a resist mask 217, and phosphorus is added. In this step, the dose amount is larger than the previous step.

Figure 3A:
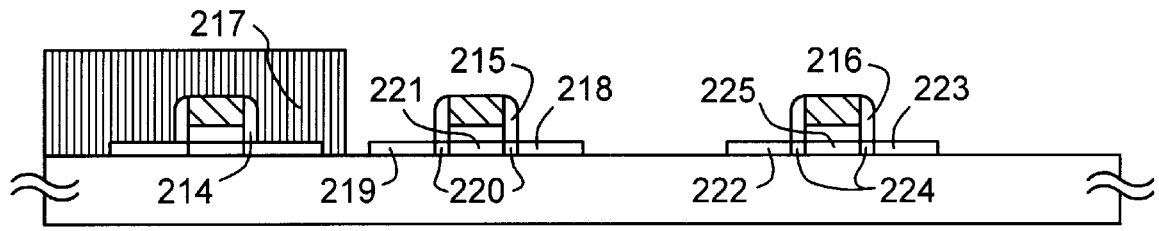
FIGS. 3A, 3B and 3C are figures showing the process for producing TFTs.

Through the addition step of phosphorus, a source region 218, a drain region 219, a low concentration impurity region (LDD region) 220 and a channel forming region 221 of the NTFT constituting the CMOS circuit are fixed. A source region 222, a drain region 223, a low concentration impurity region (LDD region) 224 and a channel forming region 225 of the NTFT constituting the pixel matrix circuit are also fixed. (FIG. 3A)

Figure 3B:
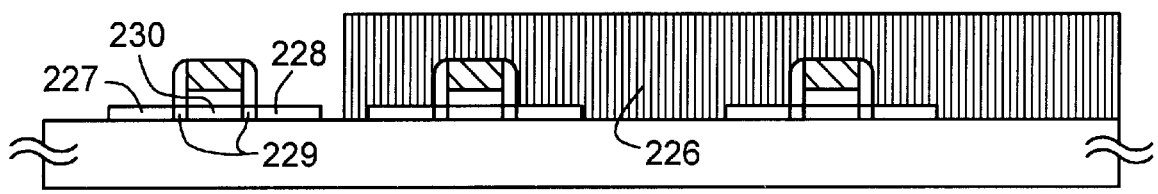

After removing the resist mask 214, the region to be the NTFT is covered with a resist mask 226, and boron is added to a dose amount higher than the previous step. Through the addition step of boron, a source region 227, a drain region 228, a low concentration impurity region (LDD region) 229 and a channel forming region 230 of the PTFT constituting the CMOS circuit are fixed. (FIG. 3B)

After finishing the addition steps of impurities to the active layer as described above, a heat treatment is conducted by furnace annealing, laser annealing or lamp annealing, to activate the impurities added. In this step, damage suffered by the active layer on addition of the impurities is also recovered.

In the channel forming regions 221, 225 and 230, no impurity element is added, and they are intrinsic or substantially intrinsic regions. The term "substantially intrinsic" used herein means that the concentration of the impurity imparting N type or P type conductivity is less than the spin density of the channel forming region, or the concentration of the impurity falls within the range of from $1\times10^{14}$ to $1\times10^{17}$ atoms/cm$^3$.

A first interlayer insulating film 231 comprising a laminated film of a silicon nitride film having a thickness of 25 nm and a silicon oxide film having a thickness of 900 nm is then formed. Source electrodes 232, 233 and 234 and drain electrodes 235 and 236 each comprising a laminated film of Ti/Al/Ti (film thickness: 100/500/100 nm) are formed.

A second interlayer insulating film comprising a laminated structure of a silicon nitride film 237 having a thickness of 50 nm, a silicon oxide film (not shown in the figure) having a thickness of 20 nm, and an organic resin film 238 having a thickness of 1 μm is formed. As the organic resin film, polyimide, acryl and polyamide may be used. The silicon oxide film having a thickness of 20 nm functions as an etching stopper on dry etching the organic resin film 238.

After forming the second interlayer insulating film, the organic resin film 238 is etched in the region where an auxiliary capacitance is formed later, to provide an opening. At the bottom of the opening, only the silicon nitride film 237 remains, or the silicon nitride film 237 and the silicon oxide film (not shown in the figure) remain.

A titanium film having a thickness of 300 nm is formed, and a black mask 239 is formed by patterning it. The black mask 239 is arranged in the pixel matrix circuit at a part that should be shielded from light, such as the TFT and the wiring part.

In the opening described above, the drain electrode 236 of the pixel matrix circuit and the black mask 239 are close to each other with the silicon nitride film 237 (or the laminated film of a silicon nitride film and a silicon oxide film) inserted therebetween.

In this example, while the black mask 239 is maintained at a fixed potential, an auxiliary capacitance 240 comprising the drain electrode 236 as a lower electrode and the black mask 239 as an upper electrode is constituted. In this case, since the dielectric material is very thin and has a large dielectric constant, a large capacitance can be obtained.

After forming the black mask 239 and the auxiliary capacitance 240, an organic resin film having a thickness of 1 μm is again formed to be a third interlayer insulating film 241. A contact hole is formed to produce a pixel electrode 242 comprising a transparent conductive film (typically ITO) having a thickness of 120 nm.

Figure 3C:
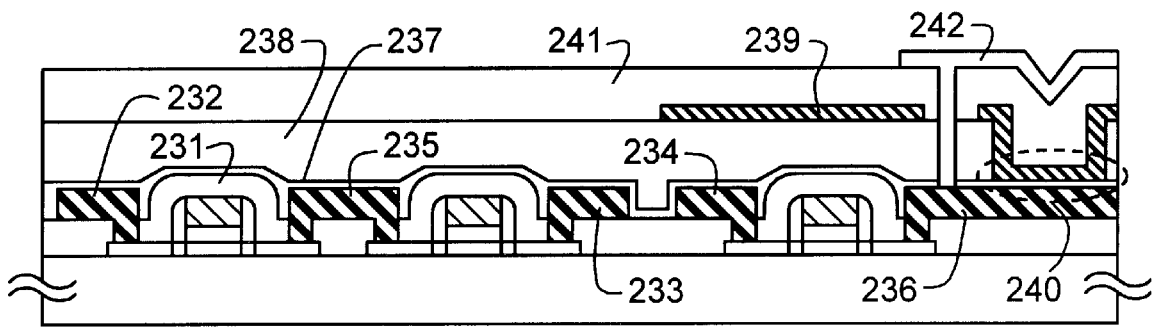

Finally, a heat treatment is conducted in a hydrogen atmosphere at 350° C. for about 2 hours, to conduct hydrogenation of the whole device. As a result, an active matrix substrate shown in FIG. 3C is completed. It can be fabricated into an AMLCD shown in FIG. 6 by sandwiching a liquid crystal layer with a counter substrate according to the known cell fabrication process.

Figure 6:
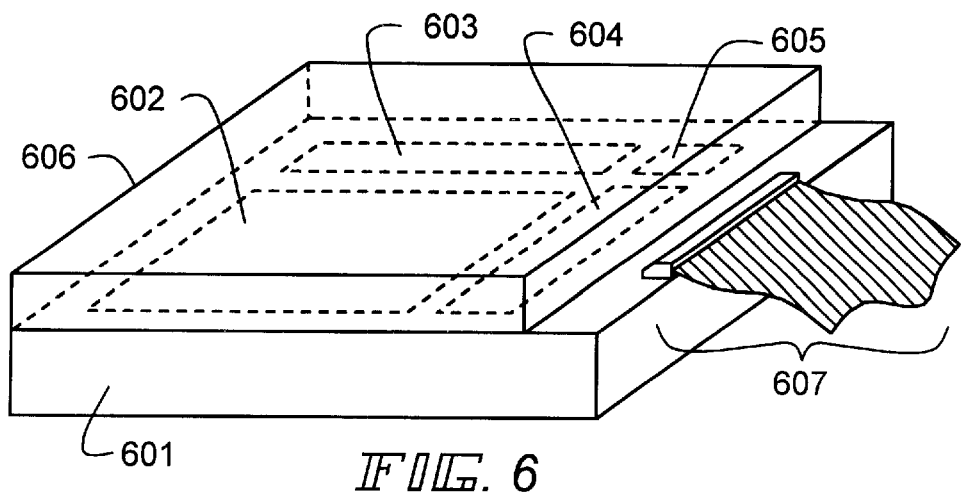
FIG. 6 is a figure showing the constitution of an active matrix liquid crystal display apparatus.

In FIG. 6, numeral 601 denotes a substrate, 602 denotes a pixel matrix circuit, 603 denotes a source driver circuit, 604 denotes a gate driver circuit, 605 denotes a logic circuit, 606 denotes a counter substrate and 607 denotes an FPC (flexible printed circuit). The logic circuit 605 is a circuit for processing signals required for displaying an image, and includes a clock generating circuit and γ compensation circuit. The AMLCD of this example comprises circuits of TFTs exhibiting high operation performance, and thus can be used for digital driving and analog driving. Specifically, the mobility (field effect mobility) of the TFT of this example is from 200 to 300 $cm^2/Vs$ for the N channel type, and from 150 to 250 $cm^2/Vs$ for the P channel type. The subthreshold coefficient (S value) is as small as from 60 to 100 mV/decade for both the N channel type and the P channel type.

The structure of the active matrix substrate is not limited to this example, and any structure can be employed. For example, while a transparent conductive film is used as the pixel electrode in this example, this may be changed to a material having high reflection property such as an aluminum alloy film, so as to easily realize a reflection type active matrix liquid crystal display apparatus.

EXAMPLE 3

An example employing another measure as the formation method of the gate insulating film in Example 2 is described.

In Example 2, the insulating film formed by the plasma CVD process or the reduced pressure heat CVD process is used as the gate insulating film as it is. The electric characteristics of the TFT can be further improved by subjecting the insulating film to a thermal oxidation step after the formation thereof.

Specifically, after forming the gate insulating film in Example 2, a thermal oxidation step is conducted at a temperature range of from 800 to 1,050° C. (typically from 900 to 950° C.). The atmosphere for the processing may be the same as in the thermal oxidation step in Example 1. Thermal oxidation reaction at the boundary of the active layer and the gate insulating film proceeds in this step.

This embodiment is effective to suppress insulation breakage of the gate insulating film due to the edge thinning phenomenon (in which the thermal oxidized film becomes extremely thin at the edge of the active layer). Furthermore, since the boundary level between the active layer and the gate insulating film is lowered, the electric characteristics of the TFT (particularly the subthreshold coefficient) are greatly improved.

As described with reference to FIGS. 4A and 4B, defects in crystal grains are not formed when the polysilicon film after subjecting to the thermal oxidation step is cooled to room temperature.

EXAMPLE 4

While the example where the germanium film is formed on the amorphous silicon film by the plasma CVD process or the reduced pressure thermal CVD process is shown in Example 1, other processes, such as the sputtering process and the vapor deposition process, may be used to form the germanium film.

The use of the sputtering process or the vapor deposition process is advantageous in that germane gas, which is danger to handle, is not needed. Furthermore, since the germanium film can be formed at room temperature, high throughput can be obtained.

By applying this example to the production process of a TFT shown in Example 2, it is very advantageous to improve the production process.

EXAMPLE 5

An example where a spin coating process of solution coating is employed for forming the germanium film on the amorphous silicon film is described with reference to FIGS. 7A and 7B.

An amorphous silicon film 702 is formed on a quartz substrate 701. The formation conditions may accord with Example 1.

A solution containing germanium is coated on the amorphous silicon film 702. Examples of the solution include aqueous solutions of germanium oxide ($GeO_x$, typically $GeO_2$), germanium chloride ($GeCl_4$), germanium bromide ($GeBr_4$), germanium sulfide ($GeS_2$) and germanium acetate ($Ge(CH_3CO_2)$).

In some cases, an alcoholic solvent, such as ethanol and isopropyl alcohol, may be used as the solvent.

In this example, an aqueous solution of germanium oxide having a concentration of from 10 to 100 ppm is produced and coated on the amorphous silicon film 702, followed by spin drying, so as to form a layer 703 containing germanium on the amorphous silicon film 702.

Since the amorphous silicon film 702 exhibits hydrophobic property, it is preferred that a thin silicon oxide film is formed before the spin coating to increase the wettability.

Figure 7A:
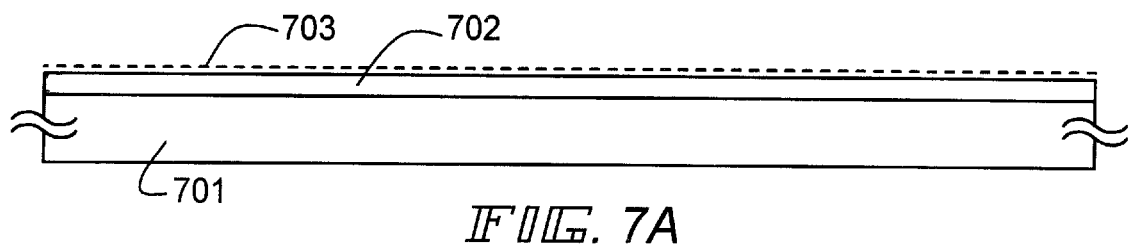
FIGS. 7A and 7B are figures showing a process for producing a polysilicon film.
Figure 7B:
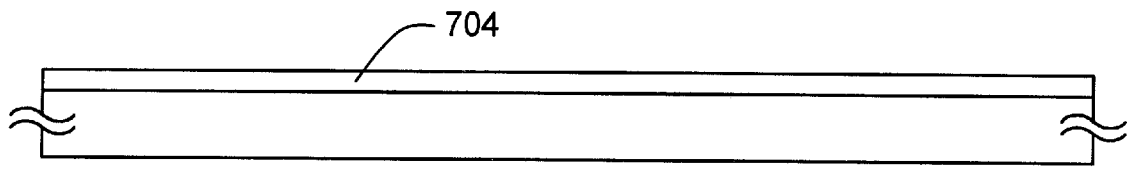

After obtaining the state shown in FIG. 7A, a heat treatment for crystallization is conducted according to the conditions shown in Example 1 to obtain a polysilicon film 704. Since a high concentration of germanium is present at the surface of the polysilicon film 704, it is preferred to wash it with an etchant, such as hydrofluoric acid.

After obtaining the polysilicon film 704 as described above, a heat treatment is conducted at a temperature exceeding the crystallization temperature according to the steps shown in Example 1. According to the steps shown in Example 2, an AMLCD shown in FIG. 6 can be produced.

EXAMPLE 6

Figure 8A:
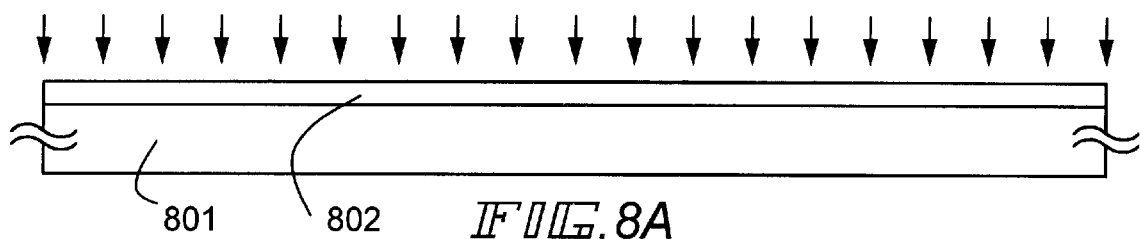
FIGS. 8A and 8B are figures showing a process for producing a polysilicon film.
Figure 8B:
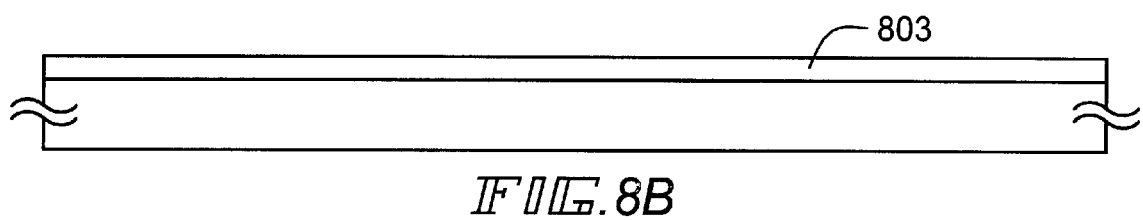

An example where a measure different from Example 1 is employed for adding germanium to the amorphous silicon film is described with reference to FIGS. 8A and 8B. Specifically, examples employing the ion implantation method, the plasma doping method and the laser doping method for an addition of germanium are shown.

An amorphous silicon film 802 is formed on a quartz substrate 801. The formation conditions may accord with Example 1. Germanium is then added by one of the ion implantation method, the plasma doping method and the laser doping method.

In this example, germane ($GeH_4$) is used as an excitation gas, and germanium is added by the plasma doping method at an acceleration voltage of 30 keV, an RF power of 5 W and a dose of $1 \times 10^{14}$ atoms/$cm^2$. The conditions are not limited to these and can be adjusted in such a manner that germanium is added to the amorphous silicon film 802 in a concentration of from $1 \times 10^{14}$ to $5 \times 10^{19}$ atoms/$cm^3$ (typically from $1 \times 10^{16}$ to $1 \times 10^{18}$ atoms/$cm^3$).

The crystallization acceleration effect of germanium as a catalyst cannot be effectively obtained unless the amount of germanium added to the amorphous silicon film is $1 \times 10^{14}$ atoms/$cm^3$ or more (preferably $1 \times 10^{16}$ atoms/$cm^3$ or more) When the addition amount exceeds $5 \times 10^{19}$ atoms/$cm^3$, it is not preferred since the amorphous silicon film has a too low melting point and is possibly melted at a temperature of about 900° C. Therefore, the upper limit of the addition amount is preferably $1 \times 10^{18}$ atoms/$cm^3$ taking room for safety.

The amorphous silicon film, to which germanium is added, is easily crystallized by a heat treatment at a temperature of from 450 to 650° C. A polysilicon film 803 obtained in this example contains a large amount of bonds, in which a silicon atom is substituted by a germanium atom, and it is considered that the polysilicon film comprises silicon germanium (represented by $Si_xGe_{1-x}$).

It is known that since silicon germanium has a band gap narrower than a silicon film, the mobility of a carrier (electron or hole) is improved. Therefore, when the fixing step of the boundary of the underlayer and the silicon film (heat treatment at a temperature exceeding the crystallization temperature), which is a characteristic feature of the invention, is applied to the polysilicon film (silicon germanium) obtained in this example, a TFT having further higher operation performance can be realized.

By producing a TFT and forming an AMLCD shown in FIG. according to the steps shown in Example 2, a display apparatus of high quality can be produced.

EXAMPLE 7

In this example, a measure is employed in that germanium is added to the amorphous silicon film on film formation of the amorphous silicon film on a substrate.

The film formation is conducted by the reduced pressure thermal CVD process or the plasma CVD process, and a gas obtained by adding a prescribed amount of germane ($GeH_4$) to silane ($SiH_4$) or disilane ($Si_2H_6$) is used as the film formation gas. A gas obtained adding germanium fluoride ($GeF_4$) to disilane may also be used.

In this measure, the addition amount of germanium can be adjusted by the flow amount of germane gas, and germane can be uniformly distributed within the amorphous silicon film. Furthermore, any special step for adding germanium is not needed, and it is effective to simplify the process.

In this example, the flow amount of germane gas is adjusted in such a manner that the germanium is added to the amorphous silicon film to a concentration of from $1 \times 10^{14}$ to $5 \times 10^{19}$ atoms/$cm^3$ (preferably from $1 \times 10^{16}$ to $1 \times 10^{18}$ atoms/$cm^3$). The explanation of these upper and lower limits of the germanium concentration has been made in Example 6 and is omitted herein.

The amorphous silicon film, to which germanium is added, is easily crystallized by a heat treatment at a temperature of from 500 to 600° C. It is considered that a polysilicon film obtained by crystallization comprises silicon germanium as similar to Example 6.

Therefore, the polysilicon film formed by the production process of this example exhibits extremely high carrier mobility, and by producing an AMLCD according to the steps shown in Example 2, an excellent display apparatus capable of displaying a high quality image can be produced.

EXAMPLE 8

In Example 1, germanium is removed through gettering by conducting the fixing step in an atmosphere containing halogen. An element selected from the group 15 (typically phosphorus) can also be used for gettering of germanium.

Figure 9A:
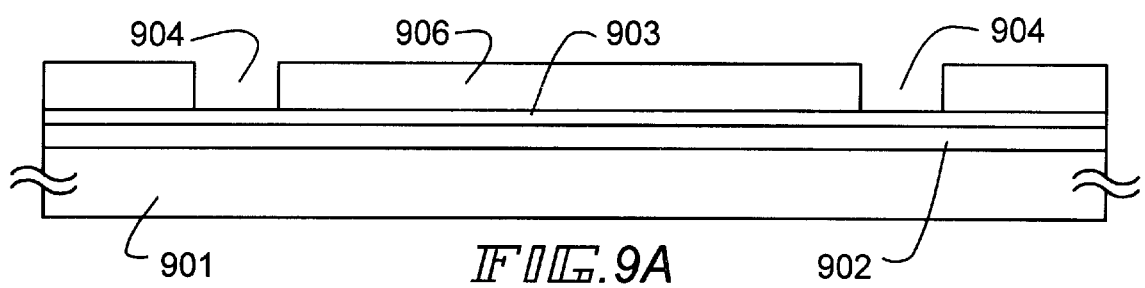
FIGS. 9A, 9B and 9C are figures showing a process for producing a polysilicon film.
Figure 9B:
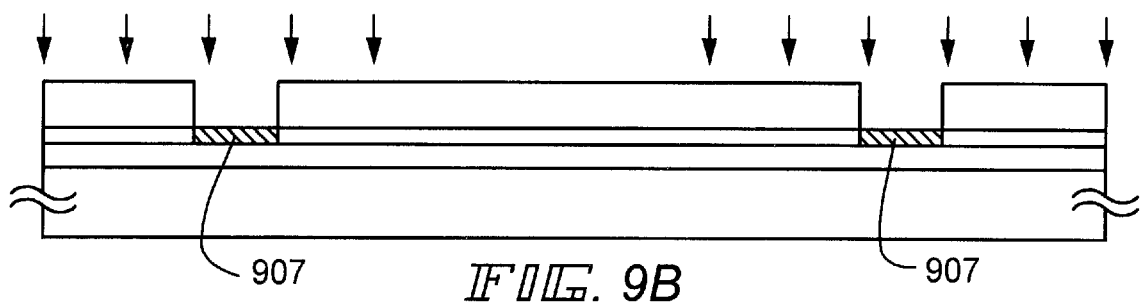
Figure 9C:
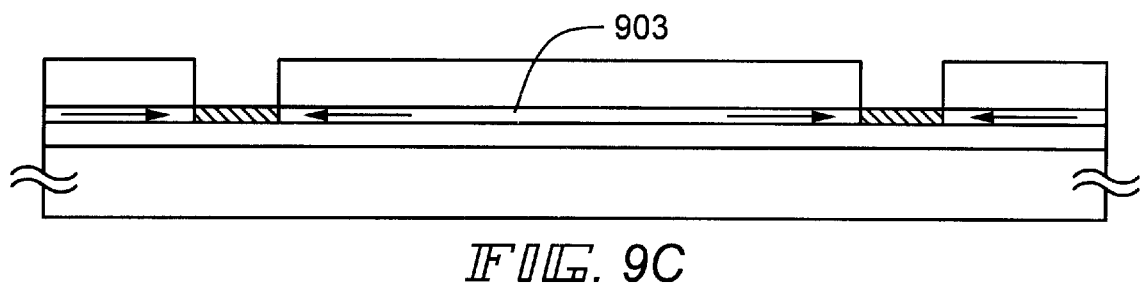

This example is described with reference to FIGS. 9A, 9B and 9C. In FIG. 9A, numeral 901 denotes a silicon substrate, 902 denotes a thermal oxidized film obtained by thermal oxidation of silicon, and 903 denotes a polysilicon film produced according to the steps of Example 1.

A mask insulating film 906 selectively having an opening 904 is formed on the polysilicon film 903. The opening 904 is formed to have a groove shape having a width of at least 20 μm. The mask insulating film 906 may be formed by an insulating film such as a silicon oxide film and may be a resist mask.

After obtaining the state shown in FIG. 9A, phosphorus is added to the whole of the substrate at an acceleration voltage of 30 kev, an RF power of 5 W and a dose amount of $1 \times 10^{14}$ atoms/$cm^2$.

A region 907, to which phosphorus is added at a high concentration, is formed through this step. This region 907 will function as a gettering site of germanium. (FIG. 9B)

A heat treatment is then conducted at a temperature of from 500 to 650° C. (typically from 550 to 600° C.) for from 4 to 12 hours. In this step, interstitial germanium present in the polysilicon film 903 (germanium of lattice invasion type) is subjected to gettering to the region 907, to which phosphorus is added at a high concentration, as shown by the arrows, and it is considered that excess germanium in the polysilicon film is reduced. (FIG. 9C)

In the polysilicon film 903 after this step, interstitial germanium is reduced, and it becomes a polysilicon film having less lattice distortion. By conducting the fixing step shown in Example 1 on the polysilicon film 903, a polysilicon film having a further high crystallinity can be obtained.

Plural TFTs are formed on the substrate according to Example 2 by using the polysilicon film, and an AMLCD shown in FIG. 6 can be produced. Because a silicon substrate is used as the substrate in this example, a reflection type LCD should be produced by using a material having high reflectivity as a pixel electrode.

Upon production of the polysilicon film 903 of this example, any of the constitutions shown in Examples 4 to 7 may be employed.

EXAMPLE 9

While the example where a germanium film is formed on or germanium is added to the whole surface of the amorphous silicon film is shown in Example 1, germanium may be selectively formed as a film or added on a part of the surface of the amorphous silicon film.

Figure 10A:
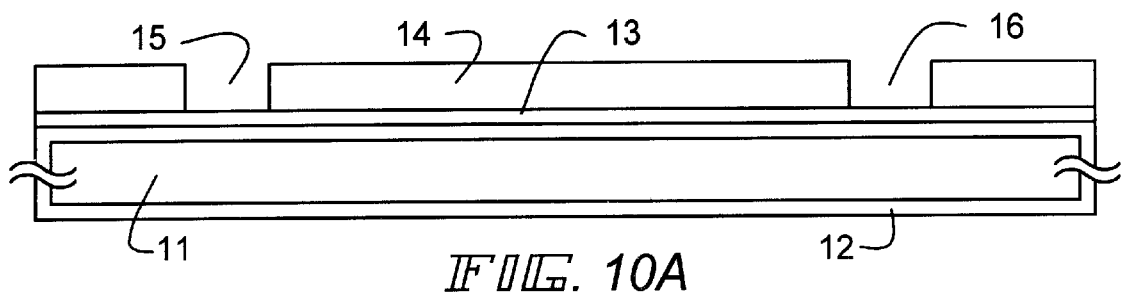
FIGS. 10A, 10B and 10C are figures showing a process for producing a polysilicon film.
Figure 10B:
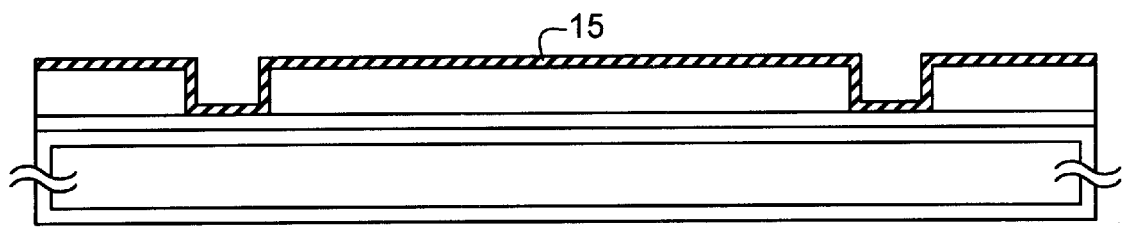
Figure 10C:
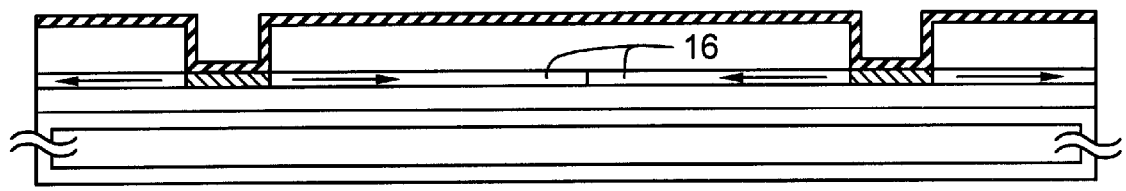

This example is described with reference to FIGS. 10A, 10B and 10C. A substrate comprising crystallized glass (also called as ceramic glass) 11 wrapped with a silicon oxide film 12 is prepared. The silicon oxide film 12 has a function of preventing a contaminant flowing from the crystallized glass 11.

The silicon oxide film 12 may be formed by the reduced pressure thermal CVD process, or may be formed by such a manner that an amorphous silicon film is formed by the reduced pressure thermal CVD process, which is then completely heat oxidized.

An amorphous silicon film 13 having a film thickness of 75 nm is formed on the silicon oxide film 12 by the reduced pressure thermal CVD process. A mask insulating film 14 comprising a silicon oxide film is formed on the amorphous silicon film 13. Openings 15 and 16 in the form of slits having a width of at least 10 $\mu$m are formed in the mask insulating film 14. (FIG. 10A)

A germanium film 15 is formed on the mask insulating film 14. The film thickness of the germanium film 15 is from 1 to 50 nm (typically from 1 to 10 nm), and it is formed by the sputtering process. (FIG. 10B)

The CVD process (shown in Example 1), the vapor deposition process and the spin coating process (shown in Example 5) may be used for the film formation of the germanium film. In this example, only the amorphous silicon film exposed through the openings 15 and 16 is in contact with the germanium film 15. A state in which germanium is selectively in contact with the amorphous silicon film 13 can be obtained.

Germanium may be added to the amorphous silicon film by the technique including the ion implantation method shown in Example 6. In such a case, germanium is selectively added only to the amorphous silicon film exposed through the openings 15 and 16.

After forming the germanium film 15, a heat treatment for crystallization is conducted. The conditions for crystallization may be basically the same as those shown in Example 1. In this example, the crystallization is conducted by furnace annealing at a temperature of from 550 to 600° C. for from 4 to 24 hours.

Since the germanium film is selectively in contact with the amorphous silicon film 13, the crystallization proceeds from the contact parts as nuclei. It is considered that the crystallization begins at the openings 15 and 16, and proceeds toward the amorphous silicon film positioned under the mask insulating film 14 in the direction indicated with the arrows in the figures. (FIG. 10C)

In this crystallization, since the crystal growth proceeds in proportion to the time, it is necessary that the time required for the crystallization reaching the desired growing length is experimentally determined. There is a tendency that the higher the temperature is, the longer the growing length per unit time is. When the temperature exceeds 600° C., the spontaneous nucleus formation increases, and thus the temperature preferably does not exceeds 600° C.

A polysilicon film 16 obtained by crystal growth in the transverse direction becomes an array of acicular or columnar crystals, the growing directions of which agree with each other. Accordingly, because the crystal grain boundaries agree with each other in a certain direction, the mobility can be improved by producing a TFT in such a manner that the growing direction of the crystals and the migration direction of the carrier agree with each other.

After obtaining the polysilicon film 16 by the steps described above, the mask insulating film 14 and the germanium film 15 on the polysilicon film 16 are removed, and the fixing step of the boundary between an underlayer and silicon is conducted under the conditions shown in Example 1.

An AMLCD having the constitution shown in FIG. 6 can be obtained by conducting the production process of Example 2 by using the polysilicon film obtained by the steps described above. In this example, the formation of the gate insulating film according to Example 3 is effective.

In the case where this example and the constitution shown in Example 8 are combined, the mask insulating film for the selective contact of the germanium film and the amorphous silicon film may be used as it is as a mask for the addition of phosphorus. Accordingly, the throughput of the production process can be greatly improved.

EXAMPLE 10

Upon forming the germanium film on the amorphous silicon film, the example using the plasma CVD process is shown in Example 1, and the example using the sputtering process or the vapor deposition process is shown in Example 4. In the invention, a film formation apparatus having a multi-chamber (cluster tool) structure may be used for forming the films.

In the film formation apparatus having a multi-chamber structure, different types of thin films can be formed in plural reaction chambers, respectively, which are connected to a common chamber. A transportation system (a robot arm) is provided in the common chamber, and delivery of a substrate between a load-lock chamber and the respective reaction chamber or between the reaction chambers is conducted.

The reaction chambers are shielded from the common chamber by a gate valve, to ensure the gas tightness. This is to prevent contamination through the common chamber.

In this example, an amorphous silicon film is formed by the plasma CVD process in the first reaction chamber, and then without exposing to the air, a germanium film is formed in the second reaction chamber. By conducting the film formation continuously, contamination at the boundary between the amorphous silicon film and the germanium film can be prevented. As an advantage of using the multi-chamber structure, the throughput is improved.

The film formation apparatus having the multi-chamber structure of this example can be applied to the case where the film formation is conducted by the plasma CVD process, and the case where the film formation is conducted by the sputtering process. It is also possible that the amorphous silicon film is formed by the plasma CVD process, and then the germanium film is continuously formed by the sputtering process.

EXAMPLE 11

While a top-gate type TFT (a planar TFT) is exemplified in Examples 1 to 10, the constitution of the invention can also be applied to a bottom-gate type TFT (typically a reverse stagger TFT). In this example, an example where the constitution of the invention is applied to a reverse stagger TFT is shown in FIG. 11.

Figure 11:
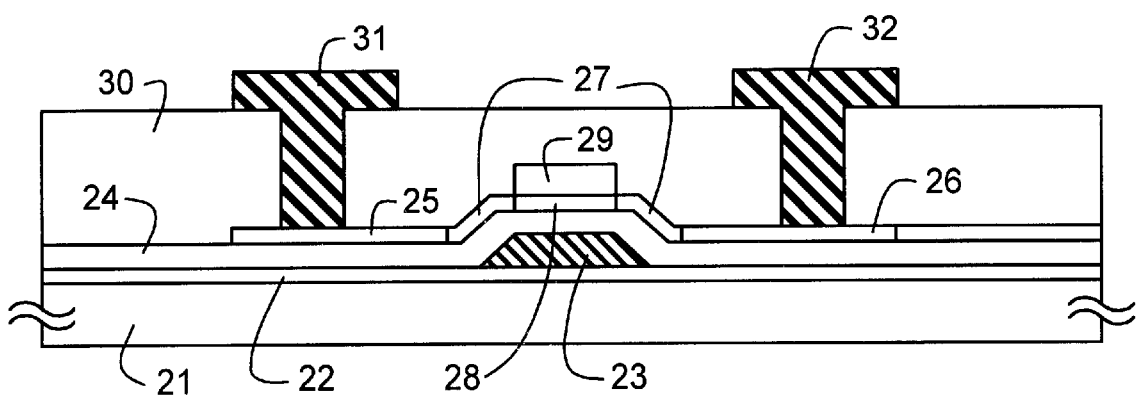
FIG. 11 is a figure showing the constitution of a reverse stagger TFT.

In FIG. 11, numeral 21 denotes quartz glass, 22 is a silicon oxide film formed as an underlayer, and 23 denotes a gate electrode formed by laminating tantalum (Ta) and tantalum nitride (TaN).

In the case of this example, because the heat treatment at a temperature exceeding the crystallization temperature of the silicon film is conducted after the formation of the gate electrode 23, a material having heat resistance that can withstand the heat treatment is used as the gate electrode 23. Such a material includes chromium, tungsten, molybdenum and polysilicon exhibiting conductivity, in addition to tantalum.

A gate insulating film 24 is then formed on the gate electrode 23 by the plasma CVD process or the reduced pressure thermal CVD process. In this example, a silicon oxide nitride film is used as the gate insulating film.

An active layer comprising a source region 25, a drain region 26, a low concentration impurity region (LDD region) 27 and a channel forming region 28 is formed on the gate insulating film 24. In this example, the source-drain region is formed by the ion implantation method or the plasma doping method. The addition by diffusion using a gas phase method or a solid phase method may also be conducted.

Numeral 29 denotes a channel protective film, which comprises an isolating film such as a silicon oxide film or a silicon nitride film. In this example, the channel protective film 29 not only protects the channel forming region 28, but also functions as a doping mask for forming the source-drain region and the low concentration impurity region.

Specifically, the channel protective film is firstly formed on the parts to be the low concentration impurity region and the channel forming region, and the source-drain region is formed by adding the impurity by using the channel protective film as a mask. Thereafter, the channel protective film is removed with remaining on the part to be the channel forming region, and the low concentration impurity region is formed by another addition of the impurity.

After completing the addition of the impurity to the active layer, a heat annealing step is conducted by either one of furnace annealing, laser annealing and lamp annealing, or by a combination of them, to conduct activation of the impurity. In this step, the channel protective film 29 remaining after the addition step of the impurity exhibits an effect of preventing diffusion of the impurity from the source-drain region or the low concentration impurity region to the channel forming region.

An acryl film having a thickness of 2 µm is formed as an interlayer insulating film 30. This may be other organic resin film, such as polyimide. In this case, the channel protective film 29 prevents the interlayer insulating film 30 comprising an acryl film and the channel forming region 28 from contacting with each other, so as to inhibit change in TFT characteristics due to organic contamination.

Contact holes are formed in the interlayer insulating film 30, to form a source electrode 31 and a drain electrode 32 mainly comprising a material containing aluminum as a main component, and finally the hydrogenation step is conducted to complete the reverse stagger TFT shown in FIG. 11.

While only the production process of the reverse stagger TFT is described in this example, it is easy to produce an AMLCD shown in Example 2 by using the reverse stagger TFT of this example.

EXAMPLE 12

While an example where a liquid crystal display apparatus is produced by using the semiconductor thin film of the invention is shown in Example 2, an active matrix type EL (electroluminescence) display apparatus and an EC (electrocromic) display apparatus can also be produced. An image sensor equipped with a photoelectric conversion layer may be integrated with the liquid crystal display apparatus, the EL display apparatus or the EC display apparatus.

The electro-optical apparatus used herein is defined as an apparatus having a function of converting an optical signal to an electric signal or a function of converting an electric signal to an optical signal, such as the display apparatus and the image sensor described above. The invention can be applied to all the electro-optical apparatus that can be produced by using semiconductor thin films formed on a substrate.

EXAMPLE 13

The invention can produce not only the electro-optical apparatuses shown in Examples 2 and 12, but also a thin film integrated circuit (or semiconductor circuit), in which functional circuits are integrated. For example, an arithmetic circuit of a microprocessor, and a high frequency circuit (MMIC: microwave module IC) for a potable apparatus can be produced.

Furthermore, a semiconductor circuit having a three-dimensional structure utilizing the advantage of the TFT using thin films can be produced, so as to produce a VLSI circuit integrated in a super high density. Accordingly, a semiconductor circuit having high functionality can be produced by using a TFT produced from the semiconductor thin film of the invention. The semiconductor circuit used herein means an electric circuit that conducts control or conversion of an electric signal by utilizing the semiconductor properties.

EXAMPLE 14

In this example, examples of electronic apparatuses (application products) equipped with the electro-optical apparatus and the semiconductor circuit shown in Examples 2, 12 and 13 are shown in FIGS. 12A to 12F. The electronic apparatus used herein means a product equipped with the semiconductor circuit and/or the electro-optical apparatus.

Examples of electronic apparatus, to which the invention can be applied, include a camcorder, an electronic still camera, a projector display, a head-mounted display, a car navigation system, a personal computer, and a portable information terminal (such as a portable computer, a cellular phone and a personal handy phone system).

Figure 12A:
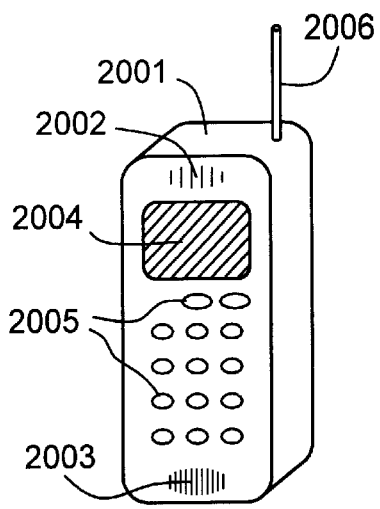
FIG. 12A through 12F are figures showing examples of electronic apparatuses.

FIG. 12A shows a cellular phone, which comprises a main body 2001, a voice output part 2002, a voice input part 2003, a display device 2004, an operation switch 2005, and an antenna 2006. The invention can be applied to the voice output part 2002, the voice input part 2003, and the display device 2004.

Figure 12B:
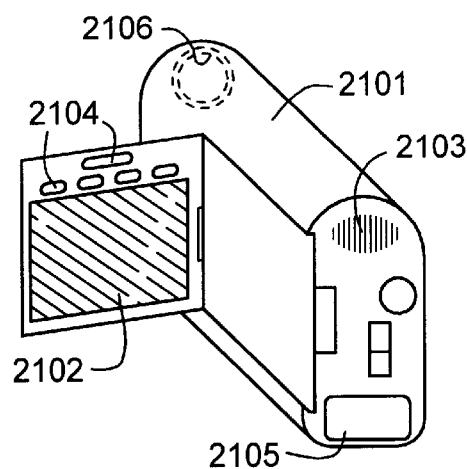

FIG. 12B shows a camcorder, which comprises a main body 2101, a display device 2102, a voice input part 2103, an operation switch 2104, a battery 2105, and an image receiving part 2106. The invention can be applied to the display device 2102, the voice input part 2103, and the image receiving part 2106.

Figure 12C:
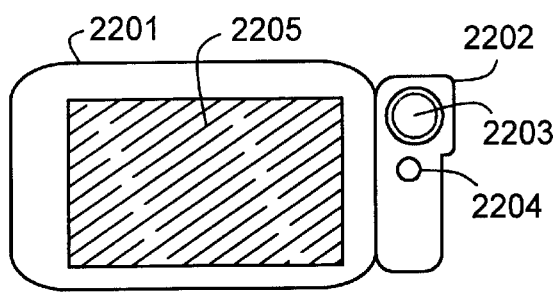

FIG. 12C shows a portable computer, which comprises a main body 2201, a camera part 2202, an image receiving part 2203, an operation switch 2204, and a display device 2205. The invention can be applied to the camera part 2202, the image receiving part 2203, and the display device 2205.

Figure 12D:
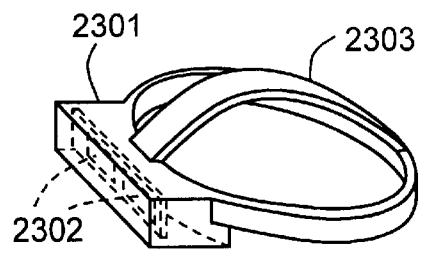

FIG. 12D shows a head-mounted display, which comprises a main body 2301, a display device 2302, and a band portion 2303. The invention can be applied to the display device 2302.

Figure 12E:
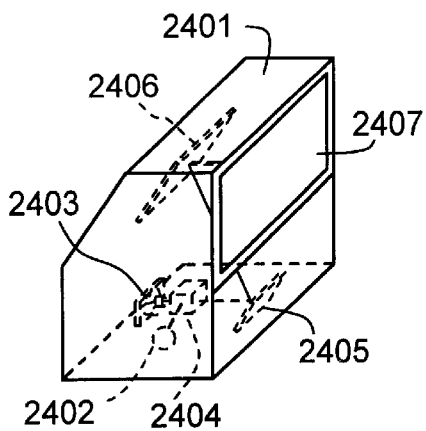

FIG. 12E shows a projection display apparatus of rear projection type, which comprises a main body 2401, a light source 2402, a display device 2403, a polarizing beam splitter 2404, reflectors 2405 and 2406, and a screen 2407. The invention can be applied to the display device 2403.

Figure 12F:
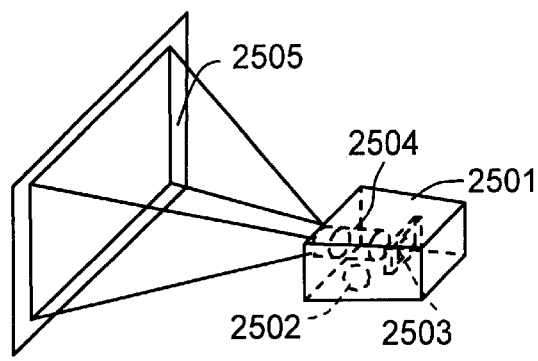

FIG. 12F shows a projection display apparatus of front projection type, which comprises a main body 2501, a light source 2502, a display device 2503, an optical system 2504, and a screen 2505. The invention can be applied to the display device 2503.

As described in the foregoing, the application field of the invention is extremely broad, and it can be applied to electronic apparatus of all fields. The invention can be applied to all products requiring an electro-optical apparatus or a semiconductor circuit.

EXAMPLE 15

This example is a modification of Example 2 and will be explained with reference to FIGS. 2A–2D and 3A–3C. After forming the active layers 202, 203, and 204 comprising crystalline silicon in the same manner as in Example 2, a gate insulating film 205 comprising silicon oxide is formed to a thickness of 5 to 50 nm. The gate insulating film may be formed by PCVD, LPCVD or thermal oxidation. As a material of the gate insulating film, silicon oxinitride or a laminate of silicon oxide and silicon oxinitride may also be used.

Then, thin film transistors are formed through the steps as described in conjunction with Example 2. However, in this example, the size of the sidewalls 214–216 is controlled so that the width of the lightly doped regions 229 (in a direction of the channel length) is within a range of 0 to 500 nm, preferably, 0 to 200 nm. Also, it is preferable to make the lightly doped region partly overlapped with the gate electrode to an extent of 0 to 50 nm in order to avoid a problem associated with hot carriers especially in an N-channel thin film transistor. Such a structure can be easily achieved by utilizing diffusion of introduced dopant impurities toward the channel forming region. Also, in this embodiment, the width of the gate electrode is so selected that the channel length in a logic circuit is set within a range from 0.125 to 0.5 $\mu$m while that in a pixel transistor and driver transistors (such as buffer transistors) is made within a range from 0.4 to 0.7 $\mu$m.

The other steps not mentioned here are basically the same as in Example 2 and hence the redundant explanation will be omitted. Thus, an active matrix type liquid crystal display device as shown in FIG. 6 is formed.

Various known liquid crystal materials such as twisted nematic liquid crystal, polymer dispersion liquid crystal, ferroelectric liquid crystal, anti-ferroelectric liquid crystal, or a mixture of ferroelectric and anti-ferroelectric liquid crystals may be used in the liquid crystal display of this example. For example, the materials disclosed in "Characteristics and Driving Scheme of Polymer-Stabilized Monostable FLCD Exhibiting Fast Response Time and High Contrast Ratio with Gray-Scale Capability" by H. Furue et al. in SID 1998, or "A Full-Color Thresholdless Antiferroelectric LCD Exhibiting Wide Viewing Angle with Fast Response Time" by T. Yoshida et ala in 1997 SID DIGEST, 841, U.S. Pat. No. 5,594,569, may be used. The entire disclosures of these articles and U.S. Patent are incorporated herein by reference.

In particular, it is most advantageous to use a so called thresholdless antiferroelectric liquid crystal (TLAFLC) in the liquid crystal device of this example, since TLAFLC can be operated with a voltage ±2.5 V (i.e. a voltage having a peak-to-peak value of 5 V) so that a voltage source of about 5 to 8 V can be utilized while a voltage used to operate the logic circuit is 3±1 V. Specifically, since the liquid crystal device using TLAFLC can be operated with such a low voltage, the width of the lightly doped region especially of the pixel transistor can be set 0–500 nm or 0–200 nm as is the case in this example.

FIG. 13 shows a characteristics between light transmittance and applied voltage in the case of using TLAFLC. Although not shown in FIG. 6, the liquid crystal panel is disposed between a pair of polarizing plates. The transmittance axis of the polarizing plate of the light incidence side is aligned in parallel with a normal to the smectic layers which in turn are aligned with a rubbing direction. The transmittance axis of the polarizing plate of the other side is set orthogonal to that of the light incidence side. By using the characteristics of FIG. 13 where the light transmittance linearly changes upon the applied voltages, it is possible to realize a gradational display by changing the applied voltage.

The liquid crystal device disclosed in this example can be advantageously used in various electronic devices as described in Example 14, in view of its low power consumption feature and a high operation capability.

By using the invention, a semiconductor film having high crystallinity can be obtained by the process that does not cause a problem of abnormal growth of silicon oxide. By using the semiconductor thin film as an active layer of a TFT, an electro-optical apparatus and a semiconductor circuit of high quality, as well as an electronic apparatus equipped with them can be realized.

What is claimed is:

1. A process for producing a semiconductor device comprising:
   forming a semiconductor film comprising silicon over a substrate,
   forming a thin film comprising an element selected from the group 14 on said semiconductor film,
   crystallizing said semiconductor film by a first heat treatment, to convert into a crystalline semiconductor film, and
   conducting a second heat treatment to said crystalline semiconductor film in an oxidizing atmosphere,
   said second heat treatment being conducted within a temperature range of 800 to 1050° C., which is higher than said first heat treatment.

2. The process according to claim 1 further comprising the steps of patterning the semiconductor film to form a semiconductor island after the second heat treatment, forming a gate insulating film on the semiconductor island, introducing an impurity into source and drain regions of the semiconductor island, and activating the impurity in the source and drain regions.

3. The process according to claim 1 wherein said semiconductor device is an electronic device selected from the group consisting of a liquid crystal device, electroluminescence display device, electrocromic display device, cellular phone, camcorder, portable computer, head-mounted display, and projection display device.

4. A process for producing a semiconductor device comprising:
    forming a semiconductor film comprising silicon over a substrate,
    forming an insulating film having an opening on said semiconductor film,
    forming a thin film comprising an element selected from the group 14 to cover said insulating film and said opening,
    crystallizing a part of said semiconductor film by a first heat treatment, to convert into a crystalline semiconductor film, and
    conducting a second heat treatment to said crystalline semiconductor film in an oxidizing atmosphere,
    said second heat treatment being conducted within a temperature range of 800 to 1050° C., which is higher than said first heat treatment.

5. A process for producing a semiconductor device as claimed in claim 4, wherein said second heat treatment is conducted in an atmosphere containing a halogen element.

6. A process for producing a semiconductor device as claimed in claim 4, wherein said thin film comprising an element selected from the group 14 is formed by a process selected from a plasma CVD, a reduced pressure thermal CVD, a vapor deposition and a sputtering.

7. A process for producing a semiconductor device as claimed in claim 4, wherein said element selected from the group 14 is germanium.

8. The process according to claim 4 further comprising the steps of patterning the semiconductor film to form a semiconductor island after the second heat treatment, forming a gate insulating film on the semiconductor island, introducing an impurity into source and drain regions of the semiconductor island, and activating the impurity in the source and drain regions.

9. The process according to claim 4 wherein said semiconductor device is an electronic device selected from the group consisting of a liquid crystal device, electroluminescence display device, electrocromic display device, cellular phone, camcorder, portable computer, head-mounted display, and projection display device.

10. A process for producing a semiconductor device comprising:
    forming a semiconductor film comprising silicon over a substrate,
    forming an insulating film having an opening on said semiconductor film,
    adding an element selected from the group 14 to an exposed part of said semiconductor film through said opening,
    crystallizing a part of said semiconductor film by a first heat treatment, to convert into a crystalline semiconductor film, and
    conducting a second heat treatment to said crystalline semiconductor film in an oxidizing atmosphere,
    said second heat treatment being conducted within a temperature range of 800 to 1050° C., which is higher than said first heat treatment.

11. A process for producing a semiconductor device as claimed in claim 10, wherein said second heat treatment is conducted in an atmosphere containing a halogen element.

12. A process for producing a semiconductor device as claimed in claim 10, wherein said adding step is conducted by a process selected from ion implantation, plasma doping and laser doping.

13. A process for producing a semiconductor device as claimed in claim 10, wherein said element selected from the group 14 is germanium.

14. The process according to claim 10 further comprising the steps of patterning the semiconductor film to form a semiconductor island after the second heat treatment, forming a gate insulating Film on the semiconductor island, introducing an impurity into source and drain regions of the semiconductor island, and activating the impurity in the source and drain regions.

15. The process according to claim 10 wherein said semiconductor device is an electronic device selected from the group consisting of a liquid crystal device, electroluminescence display device, electrocromic display device, cellular phone, camcorder, portable computer, head-mounted display, and projection display device.

16. A process for producing a semiconductor device comprising:
    forming a semiconductor film comprising silicon over a substrate,
    coating a solution containing an element selected from the group 14, followed by spin drying, to form a layer containing said element selected from the group 14 on said semiconductor film,
    crystallizing said semiconductor film by a first heat treatment, to convert into a crystalline semiconductor film, and
    conducting a second heat treatment to said crystalline semiconductor film in an oxidizing atmosphere,
    said second heat treatment being conducted within a temperature range of 800 to 1050° C., which is higher than said first heat treatment.

17. A process for producing a semiconductor device comprising:
    forming a semiconductor film comprising silicon over a substrate,
    forming an insulating film having an opening on said semiconductor film,
    coating a solution containing an element selected from the group 14, followed by spin drying, to form a layer containing said element selected from the group 14 on an exposed part of said semiconductor film through said opening,
    crystallizing a part of said semiconductor film by a first heat treatment, to convert into a crystalline semiconductor film, and
    conducting a second heat treatment to said crystalline semiconductor film in an oxidizing atmosphere,
    said second heat treatment being conducted within a temperature range of 800 to 1050° C., which is higher than said first heat treatment.

18. A process for producing a semiconductor device comprising:
    forming a semiconductor film comprising silicon over a substrate, forming a thin film comprising an element selected from the group 14 on said semiconductor film,
    crystallizing said semiconductor film by a first heat treatment, to convert into a crystalline semiconductor film, and
    conducting a second heat treatment to said crystalline semiconductor film in an oxidizing atmosphere, said first heat treatment being conducted at a temperature of from 450 to 600° C., and said second heat treatment being conducted at a temperature of from 800 to 1,050° C.

19. A process for producing a semiconductor device comprising:

forming a semiconductor film comprising silicon over a substrate, forming an insulating film having an opening on said semiconductor film, forming a thin film comprising an element selected from the group 14 to cover said insulating film and said opening, crystallizing a part of said semiconductor film by a first heat treatment, to convert into a crystalline semiconductor film, and conducting a second heat treatment to said crystalline semiconductor film in an oxidizing atmosphere, said first heat treatment being conducted at a temperature of from 450 to 600° C., and said second heat treatment being conducted at a temperature of from 800 to 1,050° C.

20. A process for producing a semiconductor device comprising:

forming a semiconductor film comprising silicon over a substrate;

coating a solution containing an element selected from the group 14, followed by spin drying, to form a layer containing said element selected from the group 14 on said semiconductor film, crystallizing a part of said semiconductor film by a first heat treatment, to convert into a crystalline semiconductor film, and conducting a second heat treatment to said crystalline semiconductor film in an oxidizing atmosphere, said first heat treatment being conducted at a temperature of from 450 to 600° C., and said second heat treatment being conducted at a temperature of from 800 to 1,050° C.

21. A process for producing a semiconductor device comprising:

forming a semiconductor film comprising silicon over a substrate, forming an insulating film having an opening on said semiconductor film, coating a solution containing an element selected from the group 14, followed by spin drying, to form a layer containing said element selected from the group 14 on an exposed part of said semiconductor film through said opening, crystallizing a part of said semiconductor film by a first heat treatment, to convert into a crystalline semiconductor film, and conducting a second heat treatment to said crystalline semiconductor film in an oxidizing atmosphere, said first heat treatment being conducted at a temperature of from 450 to 600° C., said second heat treatment being conducted at a temperature of from 800 to 1,050° C.

* * * * *